(12) United States Patent
Han et al.

(10) Patent No.: US 10,025,506 B2
(45) Date of Patent: Jul. 17, 2018

(54) SEMICONDUCTOR DEVICE HAVING NETWORK-ON-CHIP STRUCTURE AND ROUTING METHOD THEREOF

(71) Applicants: SK hynix Inc., Gyeonggi-do (KR); RESERCH & BUSINESS FOUNDATION SUNGKYUNKWAN UNIVERSITY, Gyeonggi-do (KR)

(72) Inventors: Tae Hee Han, Seoul (KR); Jun Sun Hwang, Seoul (KR)

(73) Assignees: SK Hynix Inc., Gyeonggi-do (KR); Reserch & Business Foundation Sungkyunkwan University, Gyeonggi-do (KR)

( * ) Notice: Subject to any disclaimer, the term of this patent is extended or adjusted under 35 U.S.C. 154(b) by 382 days.

(21) Appl. No.: 14/667,255

(22) Filed: Mar. 24, 2015

(65) Prior Publication Data

US 2016/0147463 A1    May 26, 2016

(30) Foreign Application Priority Data

Nov. 24, 2014    (KR) .................. 10-2014-0164403

(51) Int. Cl.
| | |
|---|---|
| *G06F 3/06* | (2006.01) |
| *H01L 23/34* | (2006.01) |
| *G06F 15/78* | (2006.01) |
| *H01L 25/065* | (2006.01) |
| *H01L 27/02* | (2006.01) |

(52) U.S. Cl.
CPC ............ *G06F 3/0613* (2013.01); *G06F 3/067* (2013.01); *G06F 3/0625* (2013.01); *G06F 3/0635* (2013.01); *G06F 15/7825* (2013.01); *H01L 23/34* (2013.01); *H01L 25/0657* (2013.01); *H01L 27/0248* (2013.01); *H01L 2225/06513* (2013.01); *H01L 2225/06541* (2013.01); *H01L 2225/06589* (2013.01); *H01L 2924/0002* (2013.01); *Y02D 10/12* (2018.01); *Y02D 10/13* (2018.01)

(58) Field of Classification Search
CPC ....... H01L 25/0657; H01L 2225/06589; H01L 2225/06541
See application file for complete search history.

(56) References Cited

U.S. PATENT DOCUMENTS

| | | | |
|---|---|---|---|
| 8,509,082 B2 | 8/2013 | Heinz et al. | |
| 8,743,703 B2 | 6/2014 | Heinz et al. | |
| 2009/0271608 A1* | 10/2009 | Gooding | ................. G06F 1/206 713/100 |
| 2015/0077173 A1* | 3/2015 | Goodnow | ........... H01L 25/0657 327/530 |

(Continued)

*Primary Examiner* — Sulaiman Nooristany
(74) *Attorney, Agent, or Firm* — IP & T Group LLP

(57) ABSTRACT

A semiconductor device includes a plurality of semiconductor chips vertically stacked and electrically coupled to one another through TSVs (Through-Silicon Vias), a plurality of semiconductor elements formed in each of the semiconductor chips, a plurality of nodes suitable for coupling the semiconductor elements to one another, and a node control device suitable for being provided in each of the nodes, deciding whether to couple the node to a communication path based on a temperature of the node, and setting a shortest communication path among the semiconductor elements.

12 Claims, 8 Drawing Sheets

(56) References Cited

U.S. PATENT DOCUMENTS

| | | | |
|---|---|---|---|
| 2015/0105932 A1* | 4/2015 | Hunt | H04L 47/25 700/300 |
| 2015/0131479 A1* | 5/2015 | Fukui | H04L 41/12 370/254 |

* cited by examiner

GENERAL NODE

NORMAL THROTTLING NODE

EMERGENCY THROTTLING NODE

SOURCE NODE

DESTINATION NODE

GENERAL NODE

NORMAL THROTTLING NODE

EMERGENCY THROTTLING NODE

SOURCE NODE

DESTINATION NODE

GENERAL NODE

NORMAL THROTTLING NODE

EMERGENCY THROTTLING NODE

SOURCE NODE

DESTINATION NODE

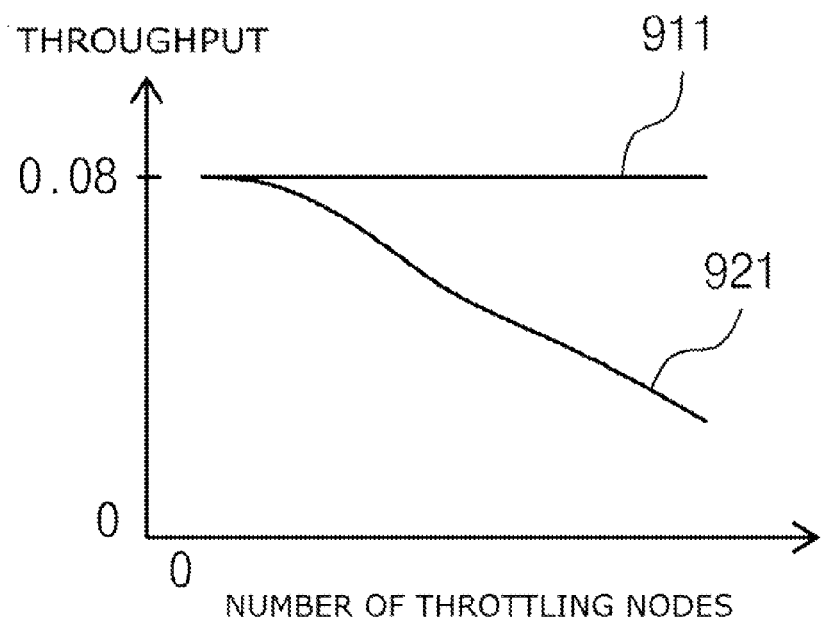

SEMICONDUCTOR DEVICE HAVING NETWORK-ON-CHIP STRUCTURE AND ROUTING METHOD THEREOF

CROSS-REFERENCE TO RELATED APPLICATIONS

The present application claims priority of Korean Patent Application No. 10-2014-0164403, filed on Nov. 24, 2014, which is incorporated herein by reference in its entirety.

BACKGROUND

1. Field

Exemplary embodiments of the present invention relate to a semiconductor device and, more particularly, to a semiconductor device having a NoC (Network-on-Chip) structure and operating based on dynamic thermal management and a routing method thereof.

2. Description of the Related Art

A semiconductor device having a general NoC structure simultaneously restricts the performance of each node through throttling to perform its own thermal management. However, in such thermal management, the semiconductor device may not have communications through a node to which the throttling is applied, resulting in degradation of its overall performance.

In order to remove such concerns, various throttling methods are provided. Since a comprehensive solution has not been provided, performance degradation of the semiconductor device is still a big issue. For example, in an existing method, when throttling occurs during routing, the routing is reset from the beginning. In this case, due to the re-routing, routing reliability is also reduced.

The cited reference (U.S. Pat. No. 8,743,703) discloses a thermal management method using throttling, but does not disclose a solution for efficiently performing the thermal management of a semiconductor device having an NoC structure.

SUMMARY

Various embodiments are directed to a semiconductor device in which performance is improved through stable thermal management and a routing method thereof.

In an embodiment, a semiconductor device includes a plurality of semiconductor chips vertically stacked and electrically coupled to one another through TSVs (Through-Silicon Vias), a plurality of semiconductor elements formed in each of the semiconductor chips, a plurality of nodes suitable for coupling the semiconductor elements to one another, and a node control device suitable for being provided in each of the node, deciding whether to couple the node to a communication path based on a temperature of the node, and setting a shortest communication path among the semiconductor elements.

In the embodiment, the node control device may include a router suitable for sharing IP (Internet Protocol) information with adjacent nodes and detecting a destination node, a processor suitable for sensing the temperature of the node, and a throttling controller coupled to the router and the processor, and suitable for managing the temperature of the node, and controlling communication path setting and coupling between the node and the destination node based on the temperature of the node.

In the embodiment, the throttling controller may include a temperature information calculating unit suitable for receiving information on the temperature of the node from the processor, and calculating parameters related to the temperature of the node, a heat estimating unit suitable for estimating whether the temperature of the node reaches a specific temperature by using the parameters calculated by the temperature information calculating unit, and a throttling managing unit suitable for controlling the node to be set as a throttling node when the temperature of the node reaches the specific temperature.

In another embodiment, a routing method of a semiconductor device includes setting a destination node among a plurality of nodes which couple a plurality of semiconductor elements in the semiconductor device, setting a shortest communication path between the destination node and a source node among the plurality of nodes, checking whether there is a node set as an emergency throttling node on the communication path, the temperature of the node reaching a critical temperature, and deciding a node on the communication path as a communication node when the node set as the emergency throttling node does not exist, and, when the node set as the emergency throttling node exists, avoiding the node and setting the communication path again.

In the embodiment, the checking whether there is the node set as the emergency throttling node may include checking a throttling table indicating nodes set as the emergency throttling node and a normal throttling node, a temperature of which reaches a specific temperature lower than the critical temperature, wherein the throttling table is stored in the semiconductor device.

As described above, according to the present invention, a node control device is provided in each node of a semiconductor device to manage stable thermal management, and a throttled node is used as a communication path.

Consequently, the re-routing of nodes is minimized and the shortest communication path is set, so that the overall performance of the semiconductor device is improved.

BRIEF DESCRIPTION OF THE DRAWINGS

FIG. 8 is a comparison table of an energy consumption amount and a power consumption amount between a typical semiconductor device and a semiconductor device in accordance with an embodiment of the present invention.

FIG. 9 is a comparison graph of the throughput of nodes between a typical semiconductor device and a semiconductor device in accordance with an embodiment of the present invention.

FIG. 10 is a comparison table of heat generation between a typical semiconductor device and a semiconductor device in accordance with an embodiment of the present invention.

DETAILED DESCRIPTION

Figure 1:
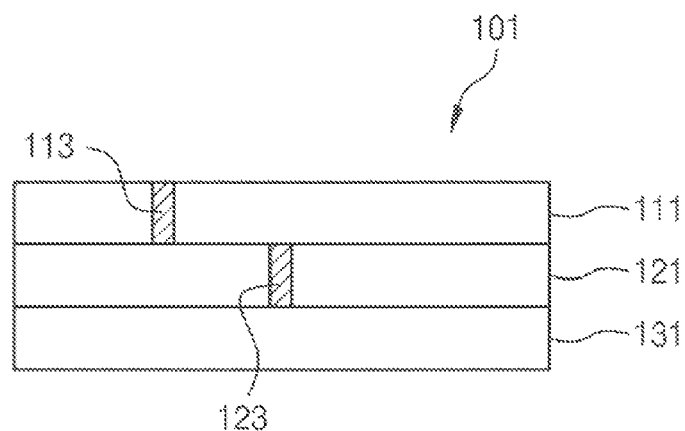
FIG. 1 is a cross-sectional view of a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Figure 2:
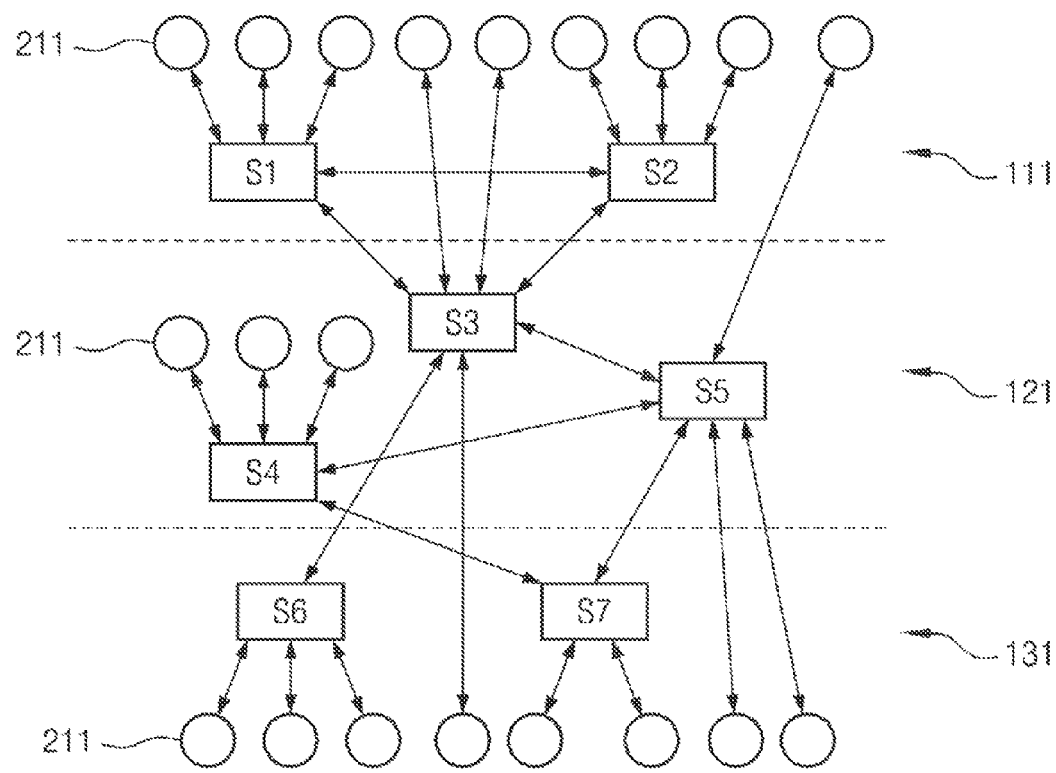
FIG. 2 is a diagram illustrating a communication structure of the semiconductor device illustrated in FIG. 1.

FIG. 1 is a cross-sectional view of a semiconductor device 101 in accordance with an embodiment of the present invention, and FIG. 2 is a diagram illustrating a communication structure of the semiconductor device 101 illustrated in FIG. 1. Referring to FIG. and FIG. 2, the structure of the semiconductor device 101 will be described.

Referring to FIG. 1, the semiconductor device 101 has a structure in which a plurality of semiconductor chips 111, 121, and 131, for example, three chips 111, 121, and 131, are stacked. The three semiconductor chips 111, 121, and 131 are electrically coupled to one another through TSV (Through-Silicon Vias) 113 and 123. That is through the TSVs 113 and 123 formed in the uppermost semiconductor chip 111 and the intermediate semiconductor chip 121, the semiconductor uppermost chip 111 may perform data communication with the intermediate semiconductor chip 121 and the lowermost semiconductor chip 131.

In each of the three semiconductor chips 111, 121, and 131 plurality of semiconductor elements 211, that is, cores and a plurality of switching elements S1 to S7 are formed. The semiconductor element 211 is provided as an element for performing a specific function, such as a controller or a memory. The switching elements S1 to S7 include an element having a switching function such as a transmission gate, a logic gate, or an inverter, and may further include an element for performing a specific function. The plurality of semiconductor elements 211 may be electrically coupled to one switching element. Consequently, one semiconductor element 211 may perform data communication with another semiconductor element 211 through at least one switching element. That is, the semiconductor elements 211 and the switching elements S1 to S7 form networks and perform data communication with one another. Since serving as nodes on the networks, the switching elements S1 to S7 may be expressed as nodes.

The plurality of semiconductor elements 211 and the switching elements S1 to S7 may be formed on one of an upper surface and a lower surface of each semiconductor chip, or both the upper surface and the lower surface thereof. Such selections are decided when the semiconductor device 101 is designed.

When the semiconductor elements 211 and the switching elements are formed only on the lower surface of the uppermost semiconductor chip 111 and the upper surface of the lowermost semiconductor chip 131, the uppermost semiconductor chip 111 and the lowermost semiconductor chip 131 may not have the TSV structure.

FIG. 1 illustrates that the three semiconductor chips 111, 121, and 131 that are stacked, for convenience. This is for illustrative purposes only, and two or four or more stacked semiconductor chips may be configured.

Referring to FIG. 2, each semiconductor chip includes the plurality of semiconductor elements 211 and the plurality of nodes S1 to S7.

The plurality of nodes S1 to S7 provide communication paths such that the plurality of semiconductor elements 211 may perform data communication with one another. The plurality of nodes S1 to S7 are classified into two-dimensional nodes and three-dimensional nodes. A number of two-dimensional nodes and three-dimensional nodes are provided.

The two-dimensional nodes are used for horizontal communication. That is, the two-dimensional nodes provide communication paths such that the semiconductor elements 211 may perform data communication with one another in the same space, for example, in one semiconductor chip.

The three-dimensional nodes are used for vertical communication. That is, the three-dimensional nodes provide communication paths such that the semiconductor elements 211 formed in different semiconductor chips, for example, respective semiconductor chips stacked vertically, may perform data communication with one another.

As described above, the semiconductor elements 211 may horizontally perform data communication through the plurality of nodes S1 to S7 in one semiconductor chip, or may vertically perform data communication among semiconductor chips that are vertically stacked.

Figure 3:
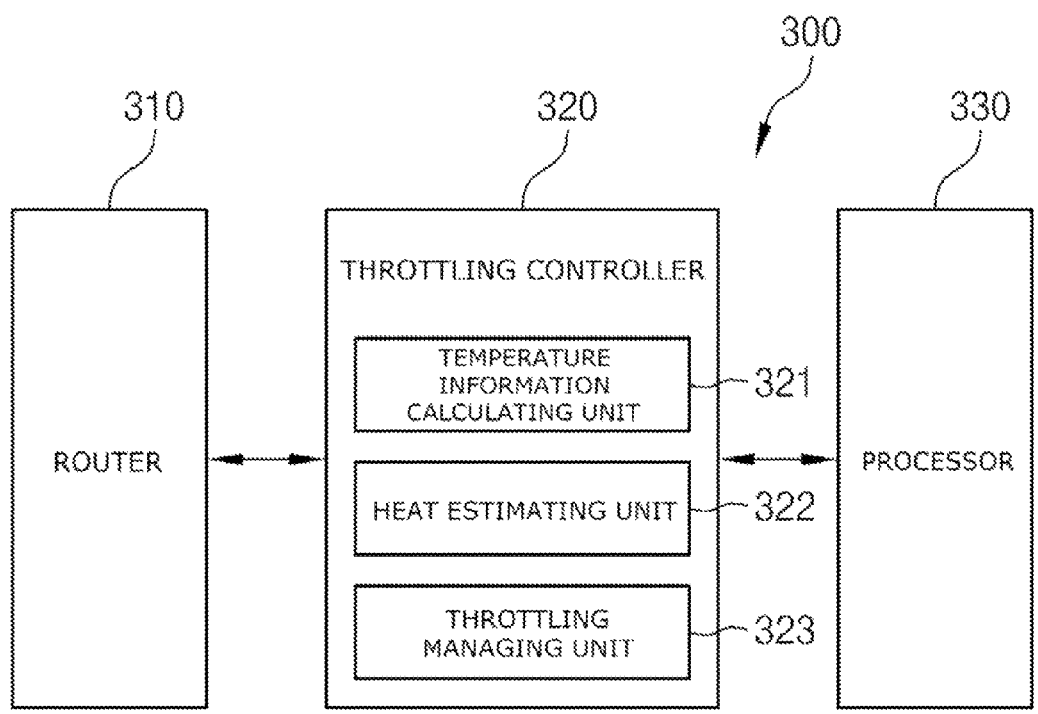
FIG. 3 is a block diagram illustrating a configuration of a node control device provided in each node illustrated in FIG. 2.

FIG. 3 is a block diagram illustrating a configuration of a node control device provided in the node illustrated in FIG. 2. Referring to FIG. 3, a node control device 300 includes a router 310, a processor 330, and a throttling controller 320.

The router 310 shares information of IPs (Internet Protocols) with adjacent node control devices, and inspects coupled nodes to detect a destination node.

The processor 330 includes a temperature sensor (not illustrated). The temperature sensor senses the temperature of a node. The processor 330 transmits information on the temperature of the node sensed by the temperature sensor to the throttling controller 320.

The throttling controller 320 is coupled to the router 310 and the processor 330. The throttling controller 320 manages the temperature of the node, and controls the communication path setting and coupling between a corresponding node and the destination node based on the temperature of the node. The throttling controller 320 includes a temperature information calculating unit 321, a heat estimating unit 322, and a throttling managing unit 323.

The temperature information calculating unit 321 receives the information on the temperature of the node from the processor 330, and calculates parameters related to the temperature of the node using the temperature of the node, such as a temperature variation by time, a time and a speed required for reaching a specific temperature, a temperature variation by current flowing through the node, a difference between a surrounding temperature and the temperature of the node, correlation between the surrounding temperature and the temperature of the node, or an amount of heat of the node by the temperature of the node.

The heat estimating unit 322 estimates whether the temperature of a node may reach a specific temperature using the parameters calculated by the temperature information calculating unit 321. For example, the heat estimating unit 322 estimates a time at which the temperature of the node reaches a trigger temperature or a critical temperature. The heat estimating unit 322 may generate the estimation data by an external request, or internally calculate the estimation data in advance and store the estimation data.

The throttling managing unit 323 controls a node to be set as a throttling node when the temperature of the node reaches the specific temperature, that is, the trigger temperature. That is, the throttling managing unit 323 controls the throttling of a node, that is, the throttling of the router 310. The throttling managing unit 323 receives data from the heat estimating unit 322, and sets a node as a general node, a normal throttling node, or an emergency throttling node when heat is generated in the node.

The node may be set as the general node when the temperature of the node is lower than the specific temperature, that is, the trigger temperature, and it operates properly. The heat is generated to increase the temperature of the node. When the temperature of the node reaches the trigger temperature, the node goes into a throttling state.

The normal throttling node is set when the temperature of a node reaches the trigger temperature. The throttling managing unit 323 prevents the normal throttling node from being coupled to the communication path if possible.

The emergency throttling node is set when the temperature of a node reaches the critical temperature beyond the trigger temperature. The throttling managing unit 323 prohibits the emergency throttling node from being coupled to the communication path.

As described above, the throttling controller 320 analyzes signals received from the processor 330, detects the temperature of a node, and controls the throttling of the node. That is, when the temperature reaches the trigger temperature, the throttling controller 320 sets the node as the normal throttling node, and when the temperature reaches the critical temperature, the throttling controller 320 sets the node as the emergency throttling node. The node set as the emergency throttling node is not used as a communication node because it is classified as a heat-risk node. That is, the emergency throttling node is not coupled to another node.

As described above, the throttling controller 320 quickly detects the temperature of a node using the temperature sensor, and limits the use of the node when the temperature of the node reaches the trigger temperature, that is, when trigger conditions of the throttling are satisfied. Then, when the temperature of the node reaches the critical temperature, the throttling controller sets the corresponding node as the emergency node and prevents the corresponding node from being used. Consequently, it is possible to immediately perform thermal management for a thermal-risk state of a node.

When the number of the emergency throttling nodes increases, routing paths are limited, resulting in the total traffic speed of the semiconductor device 101 being reduced, and the performance of the semiconductor device 101 being degraded.

In this regard, the node control device 300 avoids the emergency throttling nodes when setting a communication path, and couples the normal throttling nodes to one another, thereby enabling fast communication and reducing traffic.

The node control device 300 may apply a dynamic frequency scaling-based throttling method having a fast response speed, high reliability, and linearity with temperature to the throttling controller 320, thereby performing effective thermal management with low load.

Furthermore, the throttling controller 320 may control the router 310 to perform routing along the minimum path length and the shortest path up to a destination node, and simultaneously select nodes with the lowest load in consideration of thermal problems.

The semiconductor device 101 may further include a throttling table storing unit (not illustrated) that stores a throttling table indicating the throttling setting states of the nodes. The throttling table is stored only in a specific device, but may be stored in another element of the semiconductor device 101 as occasion demands.

Figure 4:
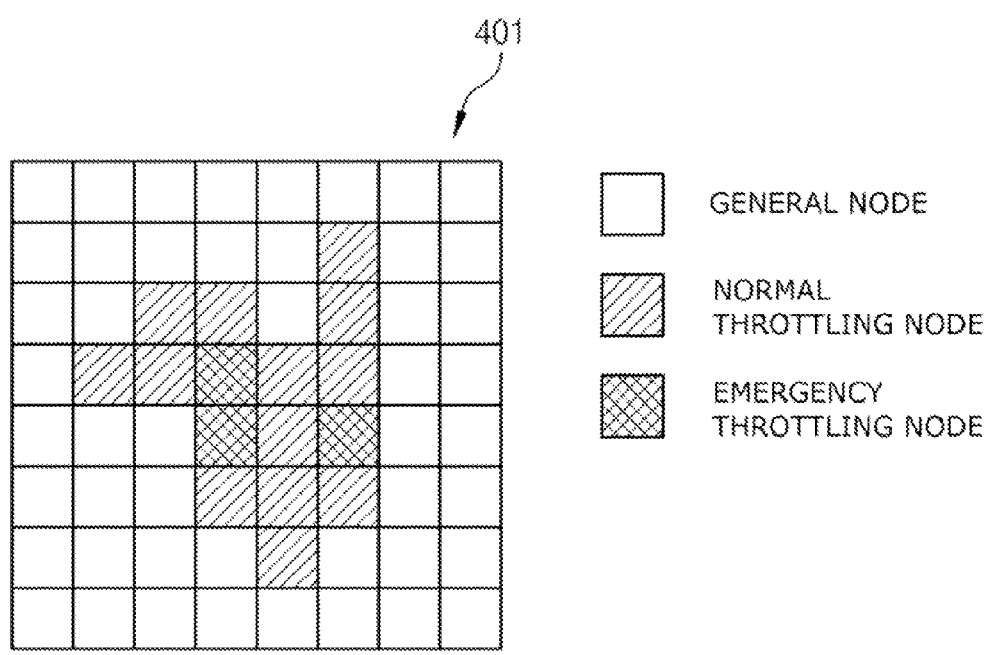
FIG. 4 illustrates a throttling table in accordance with an embodiment of the present invention.

FIG. 4 illustrates a throttling table 401 in accordance with an embodiment of the present invention. Referring to FIG. 4, the throttling table 401 shows throttling nodes. The throttling nodes are classified into normal throttling nodes and emergency throttling nodes.

The throttling table 401 is used for detecting the throttling states of nodes on communication paths and checking the normal throttling nodes and the emergency throttling nodes based on the throttling states. When throttling for restricting the performance of a node by 100% is performed without stepwise thermal management, the node is recognized as the emergency throttling node. However, when the throttling passes through the stepwise thermal management through the throttling controller 320, adaptive throttling is possible for a node, and the node is available as a communication path. Accordingly, such a distinction is shared through the throttling table 401, so that routing is performed. Through the above management, the node control device 300 may perform routing along the shortest path up to a destination node, and simultaneously select nodes with the lowest load in consideration of thermal problems.

The node control device 300 checks the throttling table 401 and sets the shortest, communication path between nodes and the destination node. When setting the shortest communication path, the node control device 300 sets a communication path passing through the general nodes without including the normal throttling nodes and the emergency throttling nodes. However, due to an increase in the normal throttling nodes and the emergency throttling nodes, the shortest communication path may be set to make a detour around the normal throttling nodes and the emergency throttling nodes, so that communication time is increased and communication speed is reduced. Consequently, when the shortest communication path is set to make a detour around the normal throttling nodes and the emergency throttling nodes, the shortest communication path is not used in the present embodiment. That is, since the shortest communication path including the normal throttling nodes is set, the present embodiment is not affected by the increase in the normal throttling nodes.

Consequently, in the semiconductor device 101 in accordance with the embodiment of the present invention, even if the number of throttling nodes increases due to an increase in temperature, communication speed is not reduced.

Figure 5:
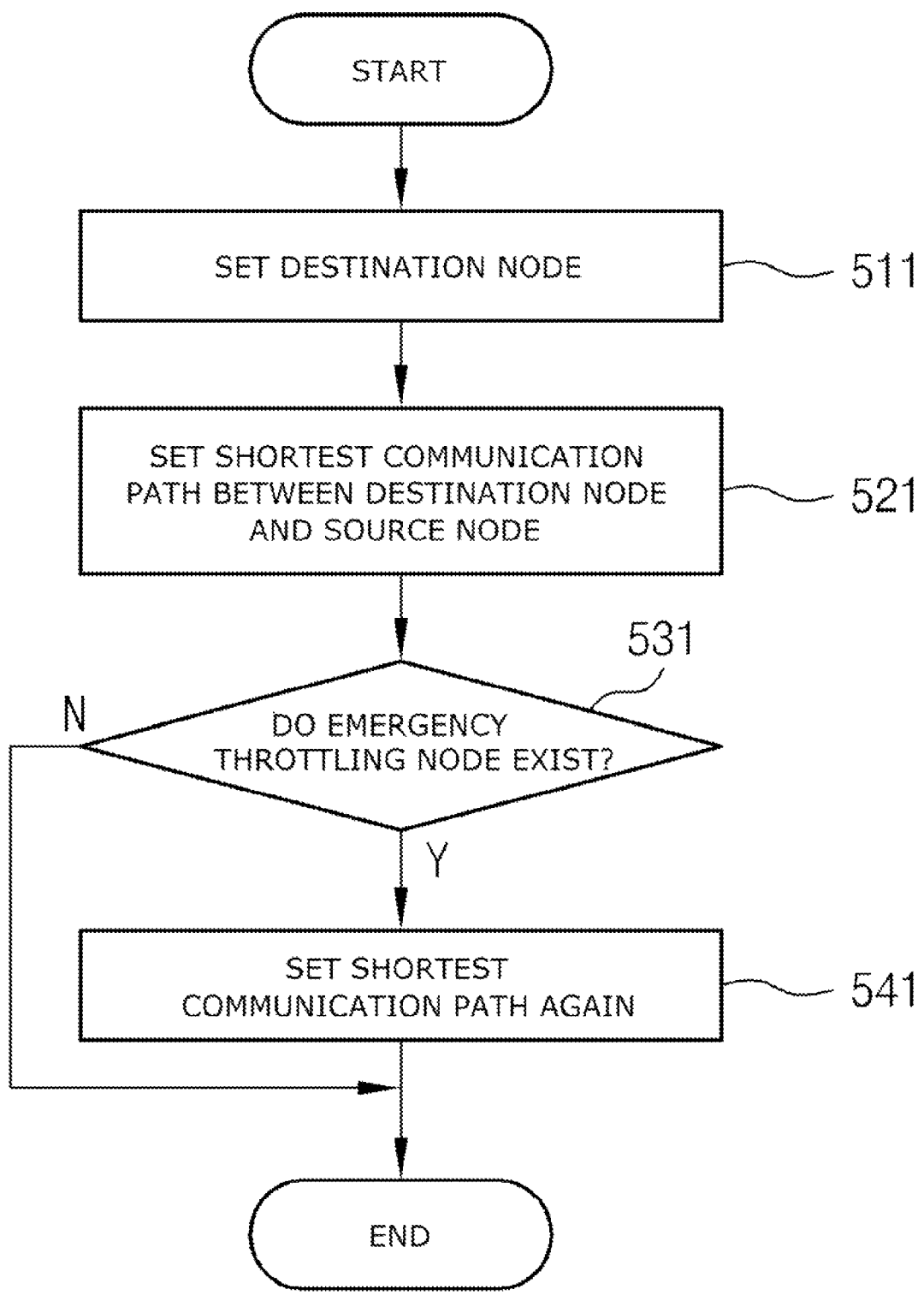
FIG. 5 is a flowchart illustrating a routing method of a semiconductor device in accordance with an embodiment of the present invention.
Figure 7A:
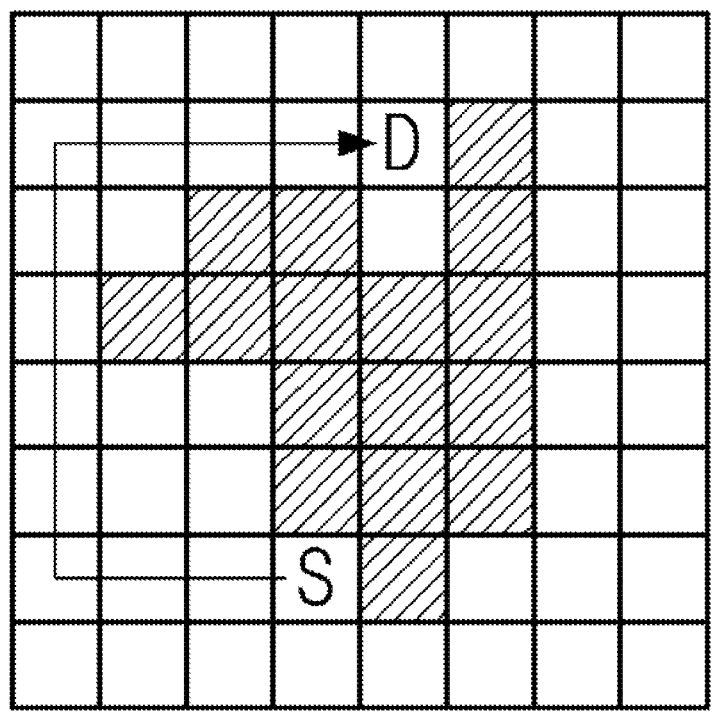
FIGS. 7A to 7C illustrate a method for setting the shortest communication path in accordance with an embodiment of the present invention.
Figure 7A:
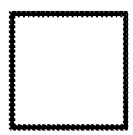
Figure 7A:
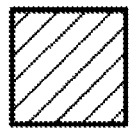
Figure 7A:
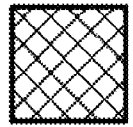
Figure 7A:
Figure 7A:
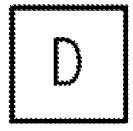
Figure 7B:
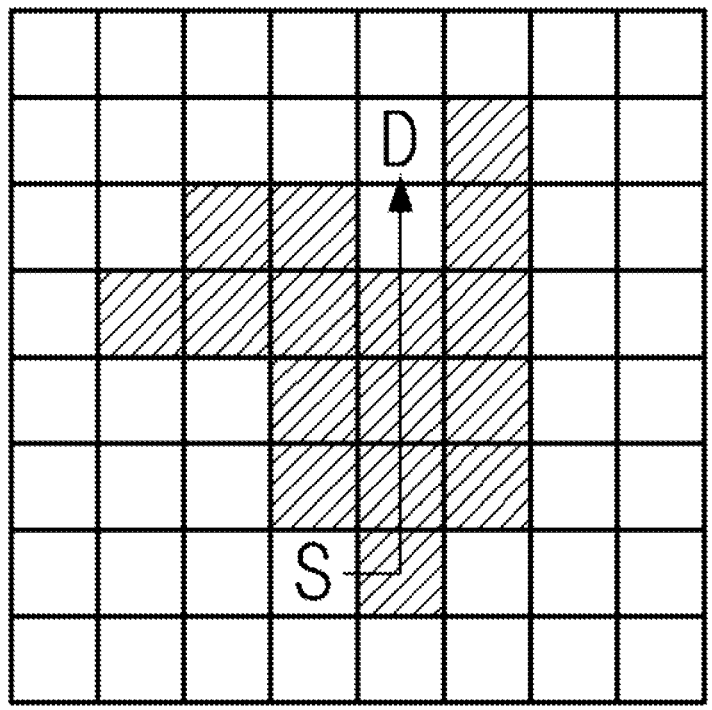
Figure 7B:
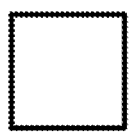
Figure 7B:
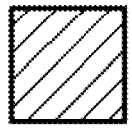
Figure 7B:
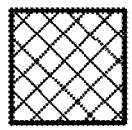
Figure 7B:
Figure 7B:
Figure 7C:
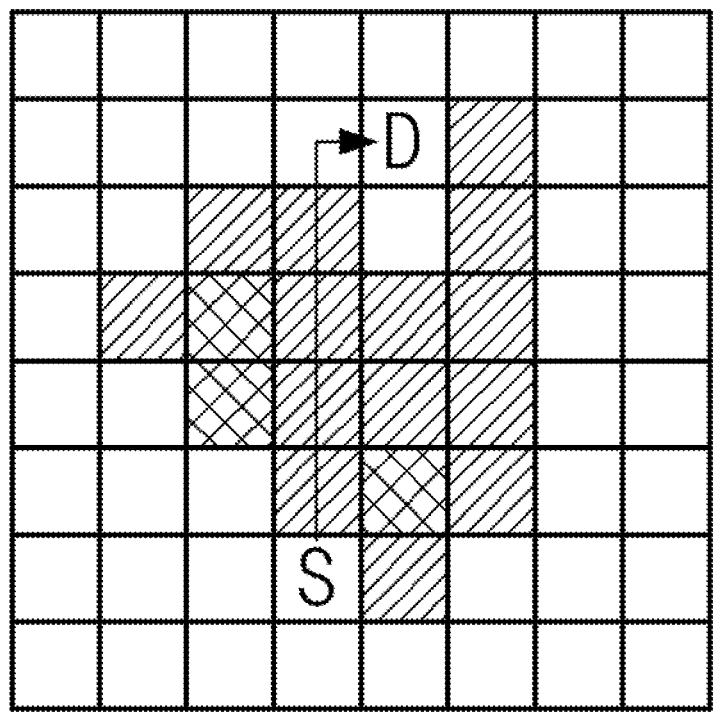
Figure 7C:
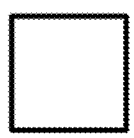
Figure 7C:
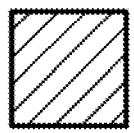
Figure 7C:
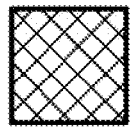
Figure 7C:
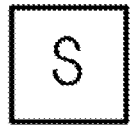
Figure 7C:
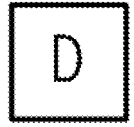

FIG. 5 is a flowchart illustrating a routing method of a semiconductor device 101 in accordance with an embodiment of the present invention, and FIGS. 7A to 7C illustrate a method for setting the shortest communication path in accordance with an embodiment of the present invention. Referring to FIG. 1 to FIG. 4 and FIGS. 7A to 7C, the routing method illustrated in FIG. 5 will be described. Referring to FIG. 5, the routing method of the semiconductor device 101 includes first to fourth steps 511, 521, 531, and 541.

In the first step 511, the semiconductor device 101 sets a destination node (D of FIGS. 7A to 7C) to be coupled. That is, the semiconductor device 101 sets a specific node, for example, the destination node (D of FIGS. 7A to 7C) to be communicated from a source node (S of FIGS. 7A to 7C).

In the second step 521, the semiconductor device 101 sets the shortest communication path (an arrow of FIG. 7B) between the destination node (D of FIG. 7B) and the source node (S of FIG. 7B).

In the third step 531, the semiconductor device 101 checks whether the emergency throttling nodes exist on the shortest communication path (referring to FIGS. 7A to 7C). When the emergency throttling nodes exist (referring to FIGS. 7A to 7C), the semiconductor device 101 performs the fourth step 541, and when the emergency throttling nodes do not exist, the semiconductor device 101 performs data communication among the semiconductor elements 211 using the shortest communication path.

In the fourth step 541, the semiconductor device 101 sets the shortest communication path again. That is, the semiconductor device 101 sets the shortest communication path (an arrow of FIG. 7C) again such that the emergency throttling nodes are not included.

Then, the semiconductor device 101 performs the first step to the third step, thereby finding the shortest communication path including no emergency throttling node.

When the routing of the shortest communication path is performed from the source node (S of FIGS. 7A to 7C) to the destination node (D of FIGS. 7A to 7C) through the steps illustrated in FIG. 5, the semiconductor elements 211 may communicate with one another through the minimum number of hops, so that communication speed increases. Consequently, the overall network performance of the semiconductor device 101 is improved. Such performance improvement is further enhanced as the number of throttling nodes increases, so that faster processing is possible for the same workload as compared with the prior art.

As described above, the adaptive throttling method in accordance with the embodiment of the present invention is applied, so that all nodes on the NoC (Network-on-Chip) provided in the semiconductor device 101 may be applied to routing paths except for the emergency throttling nodes.

In accordance with the embodiment of the present invention, the node control device 300 may initially check the throttling table 401 and set the shortest communication path through only the general nodes without including throttling nodes between a source node and a destination node. In this case, when the shortest communication path makes a detour around the throttling nodes, as illustrated in FIG. 7A, the node control device 300 sets the shortest communication path including the normal throttling nodes.

Figure 6:
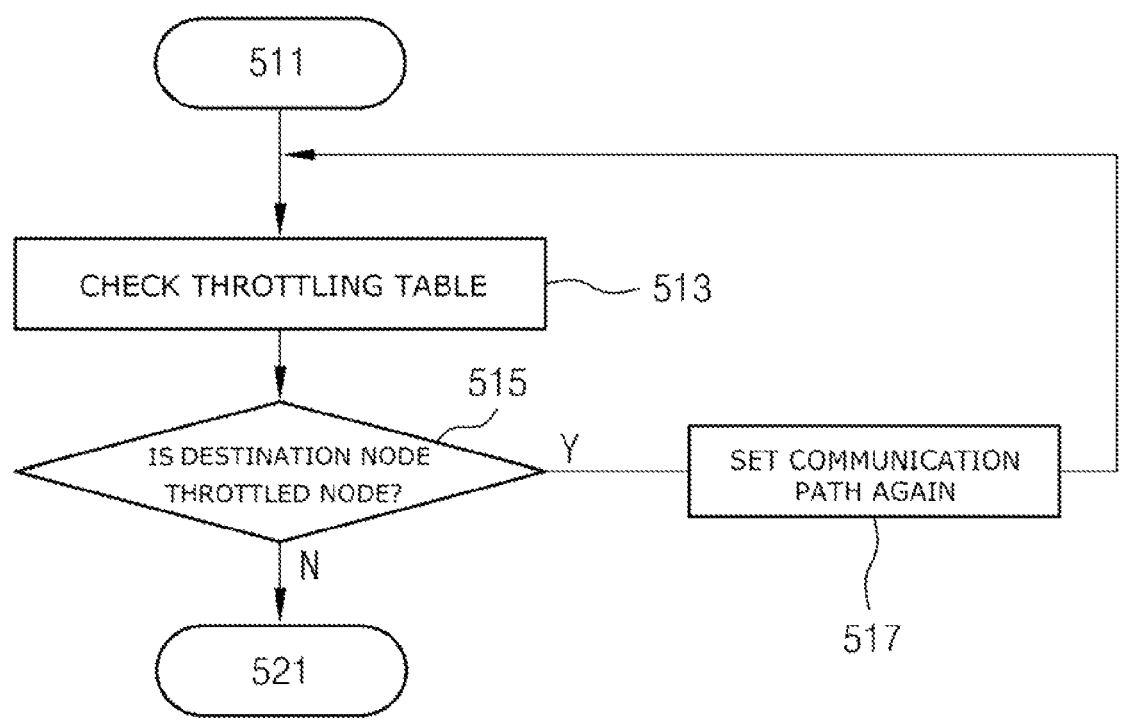
FIG. 6 is a detailed flowchart illustrating a first step illustrated in FIG. 5.

FIG. 6 is a detailed flowchart illustrating the first step 511 illustrated in FIG. 5, that is, the process of setting the destination node (D of FIGS. 7A to 7C). Referring to FIG. 6, the destination node (D of FIGS. 7A to 7C) is set, and then the following two steps 513 and 515/517 may be further performed.

In the first step 513, the semiconductor device 101 checks the throttling table 401. That is, after step 511 of setting the destination node illustrated in FIG. 5 is performed, the semiconductor device 101 checks the throttling table 401 in order to check whether there are throttled nodes.

In the second step 515/517, when the destination node (D of FIGS. 7A to 7C) is the throttled node as a result of the check of the throttling table 401 (515), the semiconductor device 101 sets a communication path again (517). That is, the semiconductor device 101 checks a throttling state again up to the destination node (D of FIGS. 7A to 7C). In this process, the throttling of nodes existing to between the source node (S of FIGS. 7A to 7C) and the destination node (D of FIGS. 7A to 7C) is set again. In such a re-setting process, when there is a node having a changed throttling state, the throttling table 401 is also set again. Accordingly, when the second step 515/517 is ended, the semiconductor device 101 checks the throttling table 401 again and then checks the throttling state of the destination node (D of FIGS. 7A to 7C). Then, the second step 521 illustrated in FIG. 5 is performed.

FIG. 8 is a comparison table of an energy consumption amount and a power consumption amount between a typical semiconductor device and the semiconductor device 101 in accordance with the embodiment of the present embodiment. Referring to FIG. 8, an energy consumption amount (94 pJ) of the semiconductor device 101 (Example B of FIG. 8) in accordance with the present embodiment is reduced by about 17% as compared with an energy consumption amount (13 pJ) of the typical semiconductor device (Example A of FIG. 8), and a power consumption amount (479 mW) of the semiconductor device 101 (Example B of FIG. 8) in accordance with the present embodiment is also reduced by about 17% as compared with a power consumption amount (577 mW) of the typical semiconductor device (Example A of FIG. 8). Such power consumption reduction is caused by the reduction of load due to re-routing through the proposed adaptive throttling, and processing for the same workload is quickly performed as compared with the prior art, so that the overall performance of the semiconductor device 101 is improved, and the semiconductor device 101 is superior in terms of reliability.

Since the adaptive throttling application method in accordance with the present embodiment uses a routing operation of throttling nodes, the power the semiconductor device 101 consumes is reduced. Since the nodes are performing throttling, packet input/output with semiconductor elements is not possible. Consequently, since a part of the function of the router 310 is not used, the semiconductor device 101 has lower power consumption compared with normal operation.

FIG. 9 is a comparison graph of the throughput of nodes between the typical semiconductor device and the semiconductor device 101 in accordance with the embodiment of the present invention. Referring to FIG. 9, it can be understood that the throughput 921 of nodes in the typical semiconductor device is gradually and significantly reduced as the number of the nodes increases, but the throughput 911 of nodes in the semiconductor device 101 in accordance with the present embodiment is reduced less even though the number of nodes increases. That is, in accordance with the present embodiment, a reduction rate of the throughput of the nodes due to an increase in the number of the nodes is low. The fact that the reduction rate of the throughput of the nodes is low represents that the performance of the semiconductor device 101 is improved. That s the performance of the semiconductor device 101 in accordance with the present embodiment is improved from 5% to a maximum of 72% as compared with a semiconductor device of the prior art.

The throughput of the nodes increases as the packet input rate (an injection rate) increases. As detour communication paths from a source node to a destination node are reduced, performance is quickly degraded due to throttling nodes. When the detour communication paths increase, performance degradation speed is relatively reduced. But as the number of the throttling nodes increases, a performance reduction rate in the same level is obtained. However, when the adaptive throwing method in accordance with the present embodiment is applied, such performance degradation is reduced, as illustrated in FIG. 9.

FIG. 10 is a comparison table of heat generation between the typical semiconductor device and the semiconductor device 101 in accordance with an embodiment of the present invention. Referring to FIG. 10 the semiconductor device 101 (Example B of FIG. 10) in accordance with the present embodiment shows a reduction in the rate of heat generation of about 10% to 11% as compared with the typical semiconductor device (Example A of FIG. 10). An 80-core processor model has heat generation of 80° C. when it operates with average performance, and FIG. 10 illustrates a result of simulating the processor model for 1,000,000 cycles.

As described above, the routing paths of the nodes of the semiconductor device 101 in accordance with the present embodiment are improved and the routing of the shortest communication path is set, so that there is high node throughput and low heat generation.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a plurality of semiconductor chips vertically stacked and electrically coupled to one another through TSVs (Through-Silicon Vias);
   a plurality of semiconductor elements formed in each of the semiconductor chips;
   a plurality of nodes suitable for coupling the semiconductor elements to one another; and
   a throttling controller suitable for being provided in each of the nodes, and setting a shortest communication path between a destination node and a source node among the plurality of nodes,
   wherein the setting the shortest communication path between the destination node and the source node among the plurality of nodes includes:
   calculating parameters related to a temperature of the node through the temperature of the node sensed;
   estimating whether the temperature of the node reaches a specific temperature or a critical temperature that is higher than the specific temperature through the calculated parameters;
   classifying the node into a normal node, a normal throttling node or an emergency throttling node according to the estimated temperature of the node;
   deciding whether to couple the node to a communication path based on a throttling state indicating the normal throttling node and the emergency throttling node; and
   setting the shortest communication path among the semiconductor elements between the destination node and the source node among the plurality of nodes by avoiding the emergency throttling node and coupling the normal node and the normal throttling node to the communication path, based on the throttling state indicating the normal throttling node and the emergency throttling node.

2. The semiconductor device of claim 1, wherein, when the temperature of the node is estimated to reach the specific temperature, the throttling controller classifies the node as the normal throttling node, and when the temperature of the node is estimated to reach the critical temperature that is higher than the specific temperature, the throttling controller classifies the node as the emergency throttling node and prohibits the node from being coupled to the communication path.

3. The semiconductor device of claim 1, further comprising:
   a router suitable for sharing IP (Internet Protocol) information with adjacent nodes and detecting a destination node; and
   a processor suitable for sensing the temperature of the node,
   wherein the throttling controller is coupled to the router and the processor, and manages the estimated temperature of the node, and controls communication path setting and coupling between the node and the destination node based on the throttling state.

4. The semiconductor device of claim 3, wherein the throttling controller comprises:
   receiving information on the temperature of the node from the processor;
   calculating parameters related to the temperature of the node;
   estimating whether the temperature of the node reaches the specific temperature or the critical temperature using the calculated parameters;
   classifying the node into the normal node, the normal throttling node or then emergency throttling node according to the estimated temperature of the node; and
   controlling the node to be set as the normal throttling node when the temperature of the node is estimated to reach the specific temperature.

5. The semiconductor device of claim 1,
   wherein the throttling controller stores the throttling state at a throttling table,
   wherein, in the throttling table, the node is set as the normal throttling node when the temperature of the node is estimated to reach the specific temperature, and the node is set as the emergency throttling node when the temperature of the node is estimated to reach the critical temperature that is higher than the specific temperature.

6. The semiconductor device of claim 1, wherein the throttling controller checks the throttling state, excludes the normal throttling node and the emergency throttling node when setting a first shortest communication path between the node and a destination node, and sets a second shortest communication path between the node and the destination node through the normal throttling node when the first shortest communication path makes a detour.

7. The semiconductor device of claim 1, wherein the TSVs are formed in the respective semiconductor chips, and the semiconductor chips perform data communication with one another through the TSVs.

8. The semiconductor device of claim 1, wherein the plurality of nodes includes:
   two-dimensional nodes suitable for performing horizontal communication in each of the semiconductor chips; and
   three-dimensional nodes suitable for performing vertical communication among the semiconductor chips.

9. A routing method of a semiconductor device, comprising:
   setting a destination node among a plurality of nodes which couple a plurality of semiconductor elements in the semiconductor device;
   setting a shortest communication path between the destination node and a source node among the plurality of nodes;
   checking whether there is a node set as an emergency throttling node on the communication path, the temperature of the node reaching a critical temperature; and deciding a node on the communication path as a communication node when the node set as the emergency throttling node does not exist, and, when the node set as the emergency throttling node exists, avoiding the node and setting the communication path again, wherein the setting the shortest communication path between the destination node and the source node among the plurality of nodes includes:

calculating parameters related to a temperature of the node through the temperature of the node sensed;

estimating whether the temperature of the node reaches a specific temperature or the critical temperature that is higher than the specific temperature through the calculated parameters;

classifying the node into a normal node, a normal throttling node or the emergency throttling node according to the estimated temperature of the node;

deciding whether to couple the node to a communication path based on a throttling state indicating the normal throttling node and the emergency throttling node; and setting the shortest communication path between the destination node and the source node among the plurality of nodes by avoiding the emergency throttling node and coupling the normal node and the normal throttling node to the communication path, based on the throttling state indicating the normal throttling node and the emergency throttling node.

10. The routing method of claim 9, wherein the checking whether there is the node set as the emergency throttling node includes:

checking a throttling table indicating nodes set as the emergency throttling node and a normal throttling node, having a temperature that reaches a specific temperature that is lower than the critical temperature, wherein the throttling table is stored in the semiconductor device.

11. The routing method of claim 10, wherein, in the setting of the shortest communication path, a path which does not include the normal throttling node is set as the shortest communication path among a plurality of shortest communication paths.

12. The routing method of claim 9, wherein, when the destination node is set as a normal throttling node, having a temperature that reaches a specific temperature that is lower than the critical temperature, the shortest communication path is set again.

* * * * *